United States Patent [19]
Kaatz et al.

[11] Patent Number: 5,499,394
[45] Date of Patent: Mar. 12, 1996

[54] FILTER SWITCHING CIRCUIT

[75] Inventors: Gary F. Kaatz, Barrington; John E. Becker, Prospect Heights, both of Ill.

[73] Assignee: Motorola, Inc., Schaumburg, Ill.

[21] Appl. No.: 249,642

[22] Filed: May 25, 1994

Related U.S. Application Data

[63] Continuation of Ser. No. 143,548, Oct. 27, 1993, abandoned, which is a continuation of Ser. No. 591,303, Oct. 1, 1990, abandoned.

[51] Int. Cl.⁶ .................................... H04B 1/16
[52] U.S. Cl. ................ 455/266; 455/307; 455/339
[58] Field of Search ............................ 455/303, 306, 455/266, 339, 340, 324, 326, 307; 375/102, 103, 316, 318; 330/51, 124 R, 126, 124 D

[56] References Cited

U.S. PATENT DOCUMENTS

| | | | |
|---|---|---|---|
| 3,769,604 | 10/1973 | Atkinson | 330/126 |
| 4,081,771 | 3/1978 | Hendrickson | 334/15 |
| 4,124,817 | 11/1978 | Takahashi | 455/266 |
| 4,352,208 | 9/1982 | Schroeder | 455/266 |
| 4,356,567 | 10/1982 | Eguchi et al. | 455/266 |
| 4,896,374 | 1/1990 | Waugh et al. | 455/326 |
| 4,972,455 | 11/1990 | Phillips et al. | 379/63 |
| 4,991,226 | 2/1991 | Bongiorno | 455/260 |
| 5,020,147 | 5/1991 | Okanobu | 455/302 |
| 5,023,939 | 6/1991 | Hori | 455/340 |

OTHER PUBLICATIONS

Robert Boylestad, "Electronic Devices and Circuit Theory", 1987, pp. 610–622.

*Primary Examiner*—Reinhard J. Eisenzopf
*Assistant Examiner*—Nguyen Vo
*Attorney, Agent, or Firm*—Randall S. Vaas

[57] ABSTRACT

A filter switching circuit for switching between two or more filters. The filter switching circuit may be integrally formed upon an integrated circuit chip and may be advantageously utilized as a portion of a dual bandwidth receiver, such as employed in a radiotelephone, operable to receive both narrowband and wideband signals.

5 Claims, 6 Drawing Sheets

FILTER SWITCHING CIRCUIT

This is a continuation of application Ser. No. 08/143,548, filed Oct. 27, 1933 and now abandoned, which is a continuation of Ser. No. 591,303 filed Oct. 1, 1990.

The present invention relates generally to integrated circuit switching circuitry, and, more particularly, to a filter switching circuit for a dual-bandwidth receiver for switching between a narrowband filter and a wideband filter to permit alternate reception of either a narrowband signal or a wideband signal.

A communication system for transmitting information between two locations is comprised, at minimum, of a transmitter and a receiver interconnected by a transmission channel upon which an information signal may be transmitted. A radio communication system, one particular type of communication system, is comprised of a transmitter and a receiver interconnected by a radio-frequency channel.

To permit transmission of an information signal upon the radio-frequency channel, the information signal is impressed upon a radio-frequency electromagnetic wave by a process referred to as modulation. The radio-frequency electromagnetic wave is of a frequency within a range of frequencies defining the radio-frequency channel.

The radio-frequency electromagnetic wave is referred to as a carder wave, and the carder wave, once modulated by the information signal, is referred to as a modulated, information signal. The modulated information signal occupies a frequency bandwidth centered at, or close to, the frequency of the carrier wave, and is transmitted through free space upon the radio-frequency channel to transmit thereby the information between the transmitter and the receiver.

Various modulation techniques have been developed to modulate the information signal upon the radio-frequency electromagnetic wave. For example, four of such modulation techniques are amplitude modulation (AM), frequency modulation (FM), phase modulation (PM), and complex modulation (CM).

A receiver which receives a modulated information signal, once transmitted over the radio-frequency channel, includes circuitry to detect, or to recreate otherwise, the information signal modulated upon the radio-frequency electromagnetic wave. This process is referred to as demodulation, and the receiver contains demodulation circuitry to demodulate the received, modulated information signal. Typically, the receiver circuitry additionally includes down conversion circuitry to convert downward in frequency the radio-frequency, modulated information signal to permit proper operation of the demodulation circuitry. Some receiver circuitry additionally contains up conversion circuitry to convert upwardly in frequency the radio-frequency, modulated information signal to permit proper operation of the demodulation circuitry.

As many different modulated information signals may be simultaneously transmitted by a plurality of transmitters at a plurality of different frequencies over many radio-frequency channels, a receiver further contains tuning circuitry to demodulate only those signals received by the receiver which are of certain desired frequencies. Such tuning circuitry typically comprises filter circuitry having passbands for passing signals only within certain bandwidths. The receiver down conversion circuitry, up conversion circuitry (if present), and the receiver demodulation circuitry may additionally contain filter circuits to prevent passage of undesired signals.

The broad range of frequencies at which modulated information signals may be transmitted is referred to as the electromagnetic frequency spectrum. The electromagnetic frequency spectrum is divided into frequency bands, and the frequency bands are divided into channels (referred to as transmission channels) upon which the modulated information signals may be transmitted. Regulation of radio-frequency communication in certain frequency bands of the electromagnetic frequency spectrum minimizes interference between simultaneously transmitted signals.

For example, in the United States, portions of a 100 MHz band of the electromagnetic frequency spectrum (extending between 800 MHz and 900 MHz) are allocated for radiotelephone communication. Such radiotelephone communication may, for example, be effectuated by radiotelephones utilized in a cellular, communication system. Existing radiotelephones contain circuitry to generate and to receive simultaneously modulated information signals.

The infrastructure required to form a cellular, communications systems is comprised of numerous base stations which are positioned at spaced-apart locations throughout a geographical area. Each of the base stations contains circuitry to receive and to transmit modulated information signals. Reception and transmission of modulated information signals to and from radiotelephones in the vicinity of individual ones of the base stations permits two-way communication therebetween.

To permit communication between a radiotelephone positioned at any location throughout the geographical area and at least one of the base stations forming the infrastructure of the cellular, communication system requires careful selection of the locations at which the base stations are positioned. Once suitably positioned, each base station defines a specific geographic portion, referred to as a "cell" of the geographical area.

Although numerous modulated information signals may be transmitted simultaneously at different transmission frequencies (i.e., over different radio-frequency channels), each modulated information signal, during transmission thereof, occupies a finite portion of the frequency band (i.e., each modulated information signal, during transmission thereof, occupies a radio-frequency channel). Overlapping of simultaneously transmitted, modulated information signals in the same geographical area, whether by transmission of these signals at the same frequency or by frequency drift of one or more signals, is impermissible as interference between overlapping signals can prevent detection of either of the transmitted modulated information signals by a receiver.

To permit such overlapping, the frequency band (which, as mentioned hereinabove, extends between 800 and 900 MHz) allocated for radiotelephone communication in the United States, is divided into 30 KHz channels. Such channel spacing over portions of the frequency band forms a channelized communication system. A first portion, extending between 824 MHz and 849 MHz of the frequency band, is allocated for the transmission of modulated information signals from a radiotelephone to a base station. A second portion, extending between 869 MHz and 894 MHz of the frequency band is allocated for the transmission of modulated information signals from a base station to a radiotelephone.

Other channelized communication systems for radiotelephone communications are similarly defined in other countries. For instance, in Japan, the frequency band allocated for radiotelephone communications is divided into 25 KHz channels.

Increased usage of cellular, communication systems, both domestically and in other countries, has resulted, in many instances, in the full utilization of every radio-frequency, transmission channel of the frequency band allocated for cellular, radiotelephone communication. Other frequency bands allocated for other uses of the electromagnetic frequency spectrum are oftentimes similarly fully utilized.

As a result, various proposals have been made to utilize more efficiently the frequency band allocated for radiotelephone communication to increase thereby the information transmission capacity of a cellular, radiotelephone communication system. Proposals have been similarly made to use more efficiently other frequency bands allocated for other uses of the electromagnetic frequency spectrum.

A modulated information signal formed by any of the above-mentioned modulation techniques, is defined by the frequency of the electromagnetic wave upon which the information signal is modulated. The modulated information signal is, however, spread-out over a band of frequencies centered at, or close to, the frequency of the carrier wave. The band of frequencies over which the modulated, information signal is spread is referred to as the bandwidth of the signal. The bandwidths of the radio-frequency transmission channels into which the frequency band allocated for cellular communication is divided, must be small enough such that simultaneously transmitted modulated information signals over adjacent radio-frequency transmission channels do not overlap. The transmission channels must additionally be wide enough to permit a certain amount of frequency drift of these signals transmitted over the transmission channels. That is, the channel spacing defining the transmission channel bandwidths must be great enough to permit frequency drift of simultaneously transmitted signals on the adjacent channels in which one, or more, of the signals exhibit frequency drift.

As previously mentioned, in the United States, the frequency band allocated for cellular communications extending between 800 and 900 MHz is divided into numerous 30 kilohertz channels. Transmitter circuitry of transmitters which transmit the signals upon the transmission channels generate signals which are somewhat smaller than the channel bandwidth. The channel bandwidth is wide enough to permit simultaneous transmission of signals on adjacent channels even when there is significant frequency drift (as a percentage of the bandwidth of a transmitted signal) of the signals transmitted upon the adjacent channels. Other cellular communication systems similarly define radio-frequency transmission channels of bandwidths to permit simultaneous transmission of signals upon adjacent transmission channels even when there is significant frequency drift of the transmitted signals.

As commercially-viable methods and apparatus for reducing signal bandwidth of transmitted signals, and for better minimizing frequency drift of the transmitted signals are developed and implemented, the bandwidths of the radio-frequency transmission channels upon which the signals are transmitted may be reduced. A reduction in the bandwidths of the radio-frequency transmission channels permits a greater number of transmission channels to be defined for a frequency band allocated for a particular use. In the particular instance of the frequency band allocated for cellular communications in the United States, a reduction in the 30 KHz bandwidth defining each radio-frequency transmission channel therein, would result in a corresponding increase in the number of transmission channels which could be defined within the allocated frequency band. For instance, by reducing the size of the bandwidths of the transmission channels from 30 KHz to 15 KHz would result in a doubling of capacity of a cellular communication system within a particular geographical area. Similarly, a reduction in the size of the bandwidths of the transmission channels of the frequency band allocated for radiotelephone communications in Japan from 25 KHz to 12.5 KHz would similarly result in a doubling of capacity of the Japanese cellular communication system.

Such a reduction in transmission channel bandwidths, however, requires alteration of the infrastructure, (i.e., base stations) as well as the radiotelephones utilized in such a cellular communication system. Because such an alteration of the infrastructure necessitates significant capital expenditures, only those cellular communication systems which are presently, or are anticipated to be, fully utilized need to be altered to permit greater numbers of radio-frequency transmission channels to be defined. However, to permit operation of a radiotelephone in both existing cellular communication systems and cellular communication systems altered to increase the capacity, thereof, the radiotelephones must contain circuitry to permit operation thereof in either an existing system or an altered system.

What is needed, therefore, is a radiotelephone construction which permits operation thereof in both a conventional, cellular communication system, and a cellular communication system of increased capacity.

SUMMARY OF THE INVENTION

It is, accordingly, an object of the present invention to provide a filter switching circuit permitting reception of a signal of either a first bandwidth, or a second bandwidth.

It is a further object of the present invention to provide a filter switching circuit for a radiotelephone to permit reception of both a wideband signal and a narrowband signal.

It is yet a further object of the present invention to provide a radiotelephone selectively operable to receive either a wideband signal or a narrowband signal.

In accordance of the present invention, therefore, a filter switching circuit for switching between at least two filters wherein a first of the filters is operative to pass signal portions of a signal within a first bandwidth, and a second of the filters is operative to pass signal portions of a signal within a second bandwidth. The filter switching circuit is operative to form an output signal indicative of signal portions within a bandwidth of a desired one of the filters, and is comprised of a drive circuit for supplying isolated drive signals to each of the filters, and a switch for switching between the filters such that signal portions of the desired one of the filters forms the output signal.

BRIEF DESCRIPTION OF THE DRAWINGS

The present invention will be better understood when read in light of the accompanying drawings in which.

DESCRIPTION OF THE PREFERRED EMBODIMENT

Figure 1:
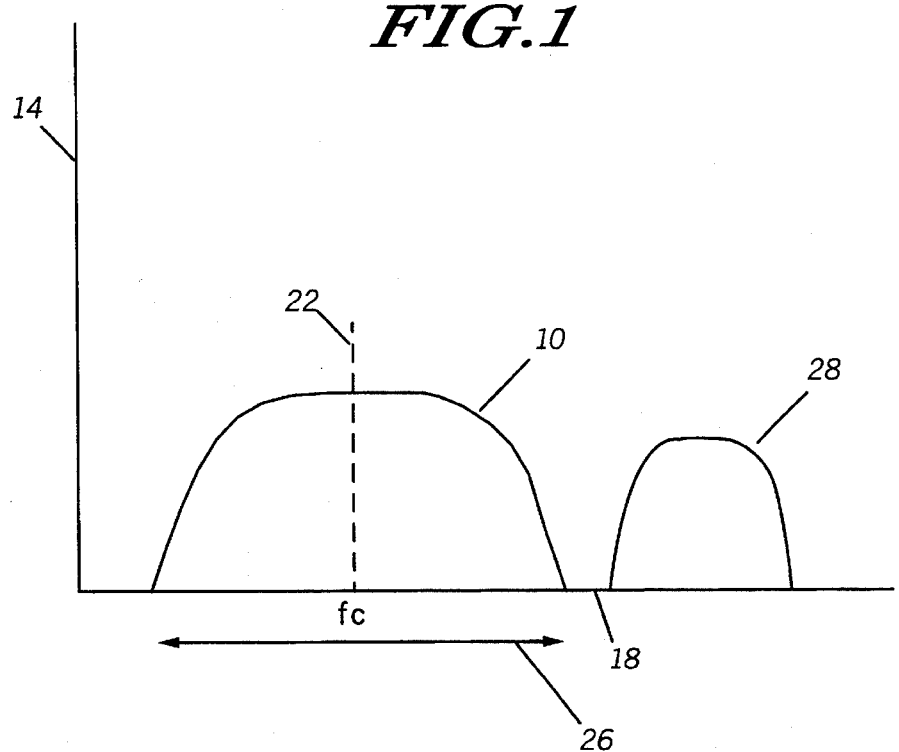
FIG. 1 is a graphical representation of a typical modulated information signal graphed as a function of frequency.

Turning first to the graphical representation of the FIG. 1, a modulated information signal, referred to generally by reference numeral 10, is plotted as a function of frequency. The level, i.e., amplitude, of the signal 10, scaled in terms of volts on ordinate axis 14, is graphed as a function of frequency, scaled in terms of hertz, on abscissa axis 18.

Signal 10 is representative of a modulated information signal formed by any of the previously mentioned modulation techniques; namely, an AM, FM, PM, or CM technique. Other modulation techniques may generate signals of different shapes. While a signal formed by a particular one of the modulation techniques may vary somewhat in amplitude, shape, and/or bandwidth, the energy of signal 10 is typically centered about a center frequency, $f_c$, of a particular frequency. As illustrated, signal 10 is symmetrical about vertically extending line 22, shown in hatch, which is defined by the center frequency fc. Signal 10 is of a frequency bandwidth of a magnitude indicated by arrow 26.

To properly determine the information content of a received signal, such as signal 10, a receiver should be of a construction to permit reception of the signal with minimum practical distortion. Filter circuitry which forms a portion of the receiver forms a filter passband for passing the desired, received signal. However, a receiver typically receives not only the desired signal (here represented by signal 10), but, additionally, other signals, such as signal 28 which is representative of, e.g., a spurious noise signal or an adjacent channel signal, located at other frequencies, including frequencies close to the bandwidth of frequencies encompassed by signal 10. Ideally, the receiver filter circuitry is of a passband to pass the desired signal in undistorted form, and all signals other than the desired signal are filtered, or otherwise blocked. However, the transmitted signal is sometimes susceptible to frequency drift which causes an alteration of the upper and lower frequency boundaries defined by the signal bandwidth. Therefore, the passband of the receiver filter circuitry must be great enough to permit passage of the transmitted signal, while also allowing for changes in frequencies caused by frequency drift of the transmitted signal. The passband of the receiver filter circuitry should be great enough to pass the received signal while accomodating frequency drift. By increasing the passband of the receiver filter circuitry, however, other signals, here represented by signal 28, are passed, thereby resulting in less than ideal signal recreation by the receiver. Decreasing the passband of the receiver filter circuitry would reduce the amount of noise passed by the receiver filter circuitry, but would increase the possibility that the desired signal would be truncated, or otherwise be not passed in undistorted form.

Figure 2:
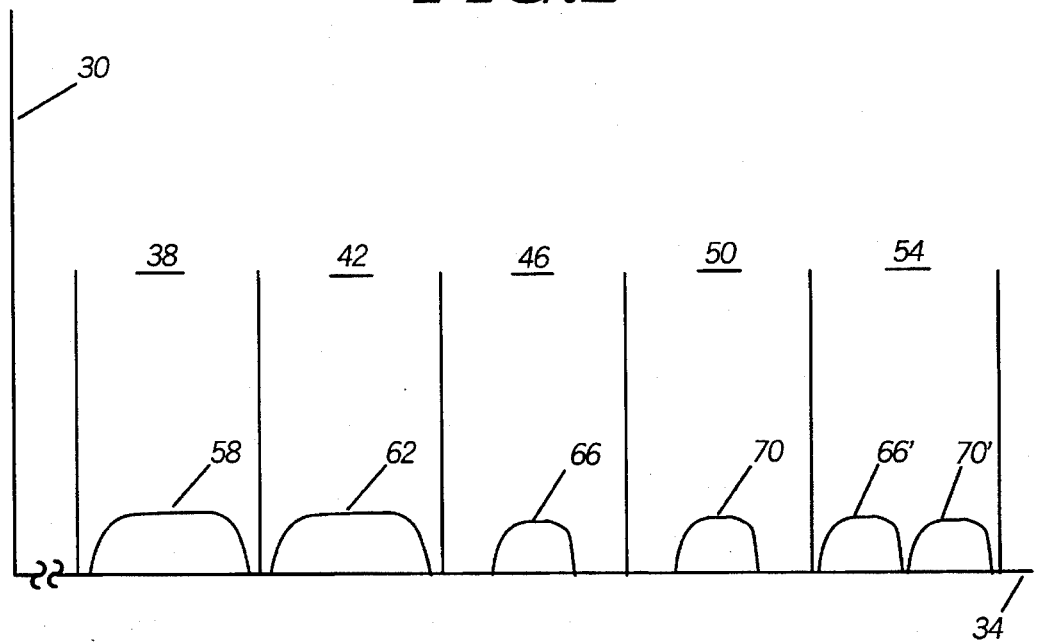
FIG. 2 is a graphical representation of several adjacent transmission channels of a frequency band formed of a portion of the electromagnetic frequency spectrum.

Turning now to the graphical representation of FIG. 2, a portion of a frequency band representative of a portion of the frequency band allocated for cellular communications is illustrated. Similar to the graph of FIG. 1, the ordinate axis, here axis 30, is scaled in terms of volts, and the abscissa axis, here axis 34, is scaled in term of hertz.

As mentioned previously, the frequency band allocated for cellular communications in the United States is divided into 30 KHz channels upon which a modulated information signal may be transmitted. FIG. 2 illustrates five of such transmission channels, here referred to by reference numerals 38, 42, 46, 50 and 54. It is to be noted that, while the frequency demarcations of abscissa axis 34 correspond to the United States cellular communication standard, virtually any channelized communication system may be similarly described with appropriate substitution of frequency demarcations. For instance, the Japanese cellular communication system may be illustrated by scaling abscissa axis 34 in terms of 25 KHz demarcations rather than the 30 KHz demarcations which correspond to the United States standard.

As illustrated with respect to the United States cellular system, the vertical lines are spaced at 30 KHz intervals to represent boundaries between adjacent ones of the transmission channels 38–54. Each transmission channel 38–54 is of a 30 KHz bandwidth, and modulated information signals, such as signal 10 of FIG. 1, may be transmitted simultaneously upon individual ones of the transmission channels 38–54 as long as the signals transmitted upon adjacent ones of the channels are not of bandwidths to overlap, or do not otherwise interfere, with signals simultaneously transmitted upon adjacent channels.

To prevent such overlapping, or other interference, the signals transmitted upon any of the transmission channels, should be of bandwidths (and center frequencies) to maintain the signals within the boundaries defining the respective transmission channels. Such control is required, not only to prevent overlapping of simultaneously transmitted signals upon adjacent transmission channels, but, additionally, because the passbands of the receiver filter circuitry are of magnitudes corresponding to the bandwidths of the transmission channels. Only those portions of a received signal within the passband of the receiver are passed (i.e., only those portions of a received signal transmitted within the boundaries of specific transmission channels such as transmission channels 38–54 are passed by the receiver).

FIG. 2 further illustrates signals 58 and 62 centered within transmission channels and 38 and 42, respectively. Signals 58 and 62 are similar to the modulated information signal 10 of FIG. 1, and are of bandwidths of magnitudes less than the magnitudes of the bandwidths which define the transmission channels 38 and 42, respectively. Signals 58 and 62 may be transmitted simultaneously as long as the signals do not overlap with one another.

Historically, the channel spacing determining channel bandwidths was defined to ensure that transmitters utilizing commercially-viable technology could transmit signals of bandwidths less than the bandwidths of the transmission channels. Technical improvements, however, have permitted the construction of commercially-viable transmitters which are capable of transmitting signals of reduced bandwidths. Therefore, commercially-viable transmitters may now be utilized to transmit signals of smaller bandwidths than the bandwidths of signals transmitted by previously-existing, commercially-viable transmitters. Commercially-viable methods and apparatus for reducing the frequency drift of transmitted signals have similarly been developed.

Positioned within channels 46 and 50 of FIG. 2 are signals 66 and 70, respectively. Signals 66 and 70 are similar in shape to signal 10 of FIG. 1, but, as compared with signals 58 and 62 positioned within channels 38 and 42, are of significantly smaller bandwidths. Signals 66' and 70' are positioned in channel 54 which are identical in shape and bandwidth with signals 66 and 70 to illustrate that the signals may be formed to require one half, or even less, of the bandwidth required of signals 58 and 62.

Because the bandwidth requirements of signals generated by transmitters of newer constructions, represented in FIG. 2 by signals 66 and 70, are significantly less than the bandwidth requirements of signals generated by conventional transmitters, represented in FIG. 2 by signals 58 and 62, significant portions of each channel of the frequency band allocated for radiotelephone communications are unused. However, by re-defining the bandwidths of the channels of the allocated frequency band to reduce thereby the bandwidths of some, or all, of the channels, greater numbers of channels may be defined over the allocated frequency band. By defining greater numbers of channels, greater numbers of signals may be transmitted simultaneously over the allocated frequency band, thereby increasing the transmission capacity of the frequency band.

Figure 3A:
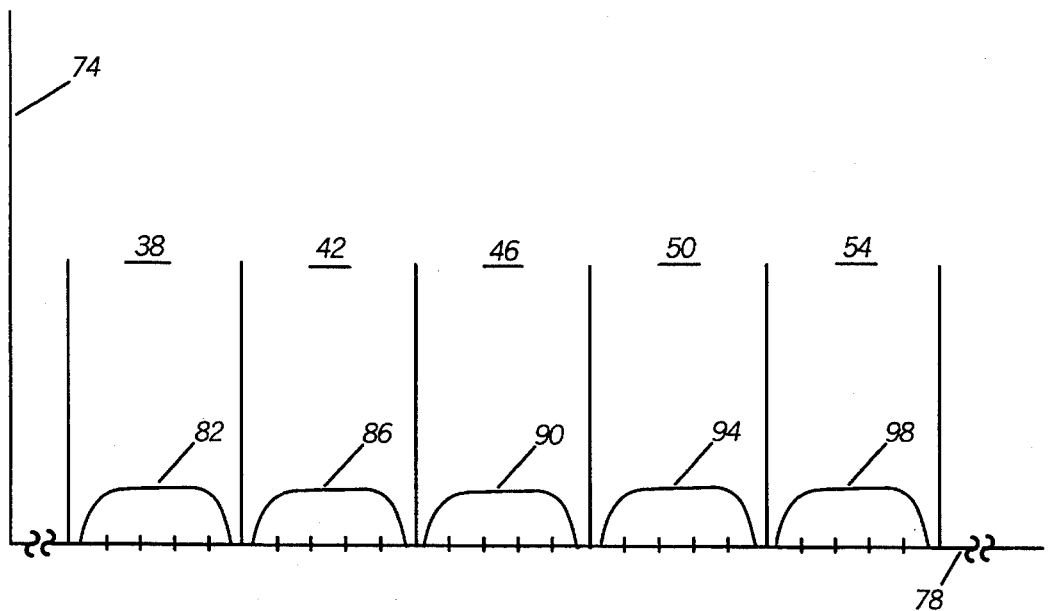
FIG. 3A is a graphical representation, similar to that of FIG. 2, but further illustrating the simultaneous transmission of modulated information signals upon adjacent transmission channels of a conventional, cellular communication system.
Figure 3B:
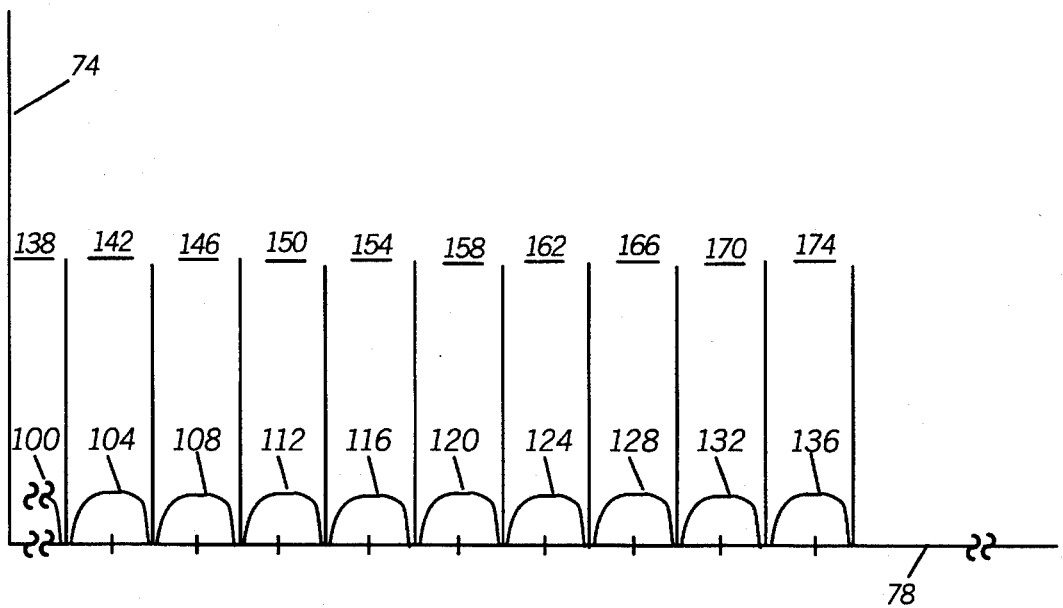
FIG. 3B is a graphical representation, similar to that of FIG. 3A, but illustrating the simultaneous transmission of modulated informations signals upon adjacent channels of a cellular communication system of increased capacity.

Turning now to the graphical representations of FIGS. 3A–3B, the increase in channel capacity may be better illustrated. The graphical representations of FIGS. 3A and 3B are similar to the graphs of FIGS. 1 and 2 and are plots of voltage, scaled in terms of volts on ordinate axes 74 of FIGS. 3A and 3B as functions of frequency, scaled in terms of hertz on abscissa axes 78.

FIG. 3A represents five simultaneously transmitted signals 82, 86, 90, 94, and 98 transmitted upon transmission channels 38, 42, 46, 50, and 54, respectively, which form a portion of the frequency band allocated for cellular communications. Signals 82–98 are of bandwidths similar to the bandwidths of signals 58–62 of FIG. 2, and channels 38–54 of FIG. 3A correspond in size with the similarly numbered channels of FIG. 2. FIG. 3A, thus, represents conventional transmission of signals over a system defined to have conventional channel spacing.

FIG. 3B represents ten simultaneously transmitted signals 100, 104, 108, 112, 116, 120, 124, 128, 132, and 136 upon channels 138, 142, 146, 150, 154, 158, 162, 166, 170, and 174. The vertically extending lines in the Figure are representative of boundaries between adjacent transmission channels. Transmission channels 138–174 occupy the same range of frequencies as do transmission channels 38–54 of FIGS. 2 and 3A, but are of bandwidths of one half of the bandwidths of transmission channels 38–54.

Comparison of FIGS. 3A and 3B illustrates that twice as many signals may be simultaneously transmitted upon the system of FIG. 3B as that of FIG. 3A. However, as previously mentioned, because alteration of existing infrastructure of a cellular system to effectuate such a reduction in transmission channel bandwidth (and commensurate increase of transmission capacity) necessitates the expenditure of significant amounts of capital, such alteration of the infrastructure is mandated only in systems which are, or which are anticipated to be, fully utilized. Because both existing systems and systems of increased capacity are to be utilized concurrently, the systems must be compatible with one another. The channel spacing of the system of FIG. 3B is compatible with the system of FIG. 3A as the number of channels of the system of FIG. 3B is a multiple of the system of FIG. 3A. A system in which the channels are of another multiple (such as, for example, a multiple of three) would similarly define a system compatible with existing systems.

Receiver circuitry forming a portion of a radiotelephone must be capable of operation in either an existing cellular communication system, or in a cellular communication system of increased capacity. Existing radiotelephone receiver circuitry permits reception and accurate demodulation of signals transmitted upon transmission channels of an existing cellular communication system. Existing radiotelephone receiver circuitry, however, is not operative to receive efficiently signals transmitted upon a system of increased capacity. Therefore, a radiotelephone construction which is operable in both an existing cellular communication system, or in a cellular communication system of increased capacity is required to permit efficient utilization of cellular communication systems of increased capacity, as well as existing communication systems.

As mentioned previously, a receiver typically includes filter circuitry having a passband of a bandwidth corresponding to the bandwidth of the transmission channel upon which the signal is transmitted. Because the transmission channels of existing, United States, cellular communication systems are of 30 KHz bandwidths, existing radiotelephones operable in the United States system, therefore, typically contain filter circuitry having passbands of nearly 30 KHz. Such a bandwidth, or the bandwidth of any corresponding existing cellular communication system, will be referred to hereinafter as a wideband bandwidth. For example, because the transmission channels of the existing Japanese, cellular communication systems are of 25 KHz bandwidths, existing radiotelephones operable in the Japanese system, therefore, typically contain filter circuitry having passbands of nearly 25 KHz. Such a bandwidth is referred to as the wideband bandwidth.

To permit proper reception of a modulated information signal transmitted in a communications system of expanded capacity, the receiver filter circuitry should be of passbands of a decreased bandwidth (namely, the passbands should be of bandwidths of one half, or some other fractional multiple, of the magnitudes of the bandwidths of the wideband bandwidth of the existing cellular communication systems). Such a reduced bandwidth, to be referred to hereinafter as a narrowband bandwidth, not only prevent passage of simultaneously transmitted signals transmitted upon adjacent transmission channels, but, additionally, reduces the amounts of white noise and other spurious signals. Filter circuitry having a passband of the narrowband bandwidth cannot be utilized, however, when receiving a modulated information signal transmitted upon a transmission channel of an existing cellular communication system as the transmitted signal may be partially, or wholly, outside of the passband of the narrowband, bandwidth filter circuitry of the receiver.

Therefore, a radiotelephone construction operable to receive modulated information signals transmitted upon transmission channels of either existing cellular communication systems, or cellular communication systems of expanded capacity, require two separate filter circuits. A first receiver filter circuit forms a passband of a wideband bandwidth, and a second filter circuit forms a passband of a narrowband bandwidth. Alternate operation of either the first filter circuit or the second filter circuit permits operation of a single radiotelephone in either an existing cellular communication system, or a cellular communication system of increased capacity.

Figure 4A:
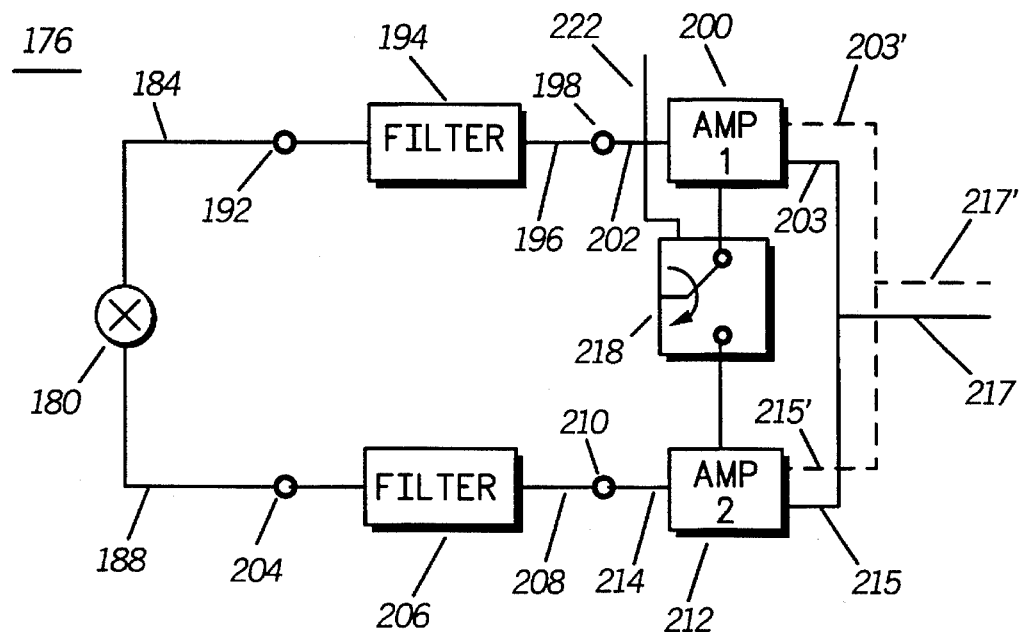
FIG. 4A is a simplified, block diagram of the filter switching circuit of a preferred embodiment of the present invention.

Turning now to the block diagram of FIG. 4A, a filter switching circuit, referred to generally by reference numeral 176, of the present invention is shown. Filter switching circuit 176 may be utilized to switch between a first filter of first filter characteristics and a second filter of second filter characteristics. The first filter of first filter characteristics preferably forms a passband of "wideband" characteristics, and the second filter of second filter characteristics preferably forms a passband of "narrowband"0 characteristics.

With respect to standard, existing, United States cellular communication systems, the wideband filter forms a passband of a bandwidth of somewhat less than 30 KHz, hence, the narrowband filter forms a passband of a bandwidth of somewhat less than 15 KHz. Similarly, with respect to standard, existing, Japanese cellular communication systems, the wideband filter forms a passband of a bandwidth of somewhat less than 25 KHz, hence, the narrowband filter forms a passband of a bandwidth of somewhat less than 12.5 KHz.

A drive circuit, here represented by mixer circuit 180, generates isolated drive signals on lines 184 and 188. Isolated drive signals are necessitated as inputs to both filter circuits cannot be directly connected theretogether as the different impedance versus frequency characteristics of the respective filters can cause interaction problems.

Line 184 is connected at node 192 to first filter circuit 194 which is preferably embodied by a conventional, ceramic, multielement ladder filter. Filter 194 is a passband filter having wideband characteristics, and, when supplied with the isolated drive signal on line 188 through node 192, passes signal portions of frequencies within the passband of filter 194 on line 196. Line 196 is coupled at node 198 to amplifier 200 on line 202. Amplifier 200 amplifies the filtered signal supplied thereto, and generates an amplified signal on line 203 when amplifier 200 is operative.

Similarly, the isolated drive signal generated on line 188 is connected at node 204 to second filter circuit 206 which is again preferably embodied by a conventional ceramic multielement ladder filter. Filter 206 is a passband filter having narrowband characteristics, and, when supplied with the isolated drive signal on line 188 through node 204, passes signal portions of frequencies within the passband of filter 206 on line 208. Line 208 is coupled at node 210 to amplifier 212 on line 214. Amplifier 212 amplifies the filtered signal supplied thereto, and generates an amplified signal on line 215 when amplifier 212 is operative.

Switch 218 alternately powers amplifier 200 or amplifier 212 such that an amplified signal is generated either on line 203 or 215. When an amplified signal is generated on line 203, no signal is generated on line 215, and vice versa. An externally supplied signal on line 222 actuates switch 218 to power either amplifier 200 or amplifier 212 to generate the amplified signal on either line 203 or 215. (In a simplest embodiment of the present invention, the signal generated on line 222 is generated by way of actuation of a conventional, mechanical switch; in another embodiment the signal generated on line 222 is generated responsive to the requirements of the EIA/TIA document EIA/TIA-IS-88. In any event, of significance is that a signal is generated on line 222 to actuate switch 218 to power either amplifier 200 or amplifier 212.) Because a signal is generated on either line 203 or line 215, lines 203 and 215 may be connected theretogether, as illustrated by line 217. FIG. 4A further illustrates, in hatch, lines 203', 215', and 217'. Signals generated on lines 203', 215', and 217' are similar to the signals generated on lines 203, 215, and 217, but are out of phase with respect to the signals generated on lines 203, 215, and 217. It is noted that operation of the circuit of FIG. 4A is, of course, possible without lines 203', 215', and 217'.

Figure 4B:
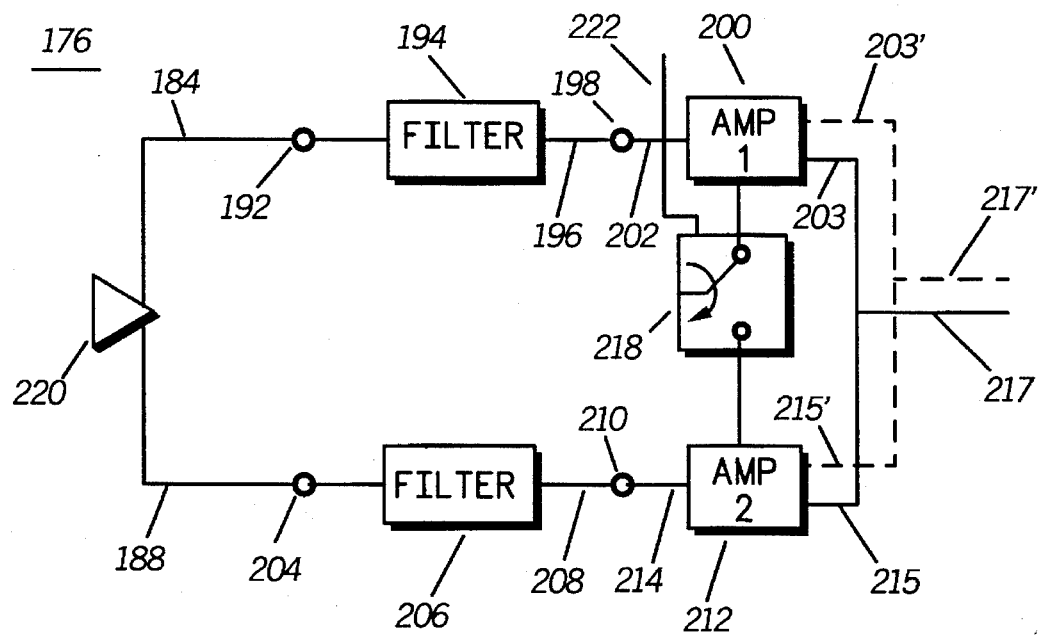
FIG. 4B is a simplified, block diagram of the filter switching circuit of an alternate, preferred embodiment of the present invention.

FIG. 4B is a block diagram similar to that of FIG. 4A but illustrates an alternate, preferred embodiment of the present invention wherein the isolated drive signals generated on lines 184 and 188 and supplied to filters 194 and 206, respectively, are supplied by amplifier 220 rather than mixer circuit 180. The remaining portions of circuit of FIG. 4B are identical to the corresponding portions of FIG. 4A, and are similarly numbered. By utilizing structure which generates isolated signal, interference within or between parts is prevented. A differential amplifier 220 may, for example, be utilized to generate isolated drive signals on line 184 and 188.

Figure 5:
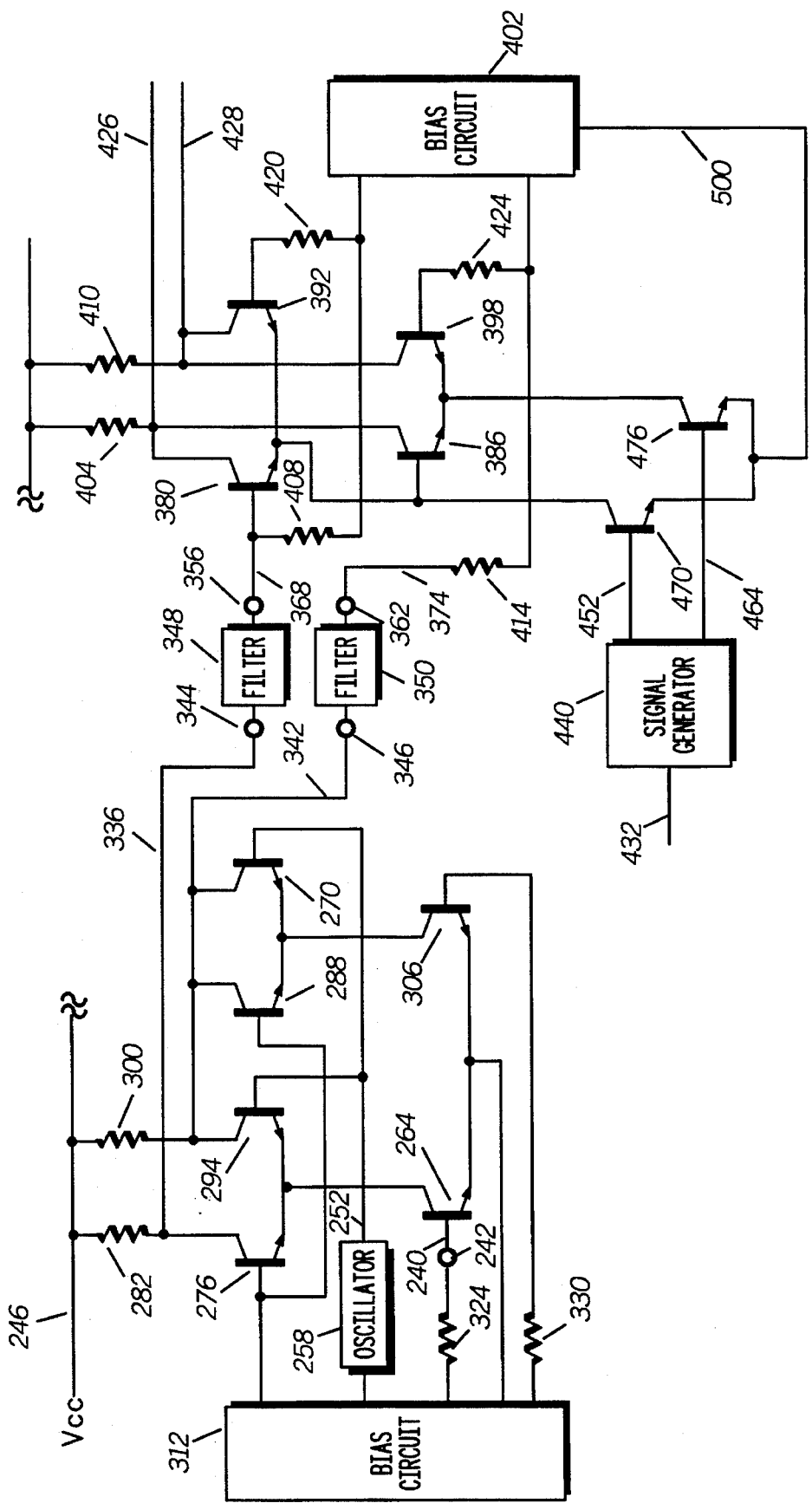
FIG. 5 is a simplified circuit schematic of the filter switching circuit of the preferred embodiment of the present invention.

FIG. 5 is a simplified circuit schematic of the filter switching circuit shown in block form in FIG. 4A. The circuit of FIG. 5 is preferably integrally formed upon a single integrated circuit chip having pin outputs and inputs to permit connection thereof with conventional filters, such as, for example, ceramic, multielement ladder filters.

A broadband, receive signal is supplied to the circuit on line 240 at node 242. Other inputs to the circuit include a supply voltage supplied to the circuit on line 246, and a high frequency, oscillating signal supplied to the circuit on line 252 by an oscillator, such as crystal oscillator 258.

Line 240 is coupled to the base electrode of transistor 264; line 252 is coupled to a base electrode of transistor 270; line 246 is coupled to collector electrodes of transistors 270 and 276 through resistor 282, and to the collector electrodes of transistors 288 and 294 through resistor 300. Emitter electrodes of transistors 270 and 288 are coupled to a collector electrode of transistor 306, and emitter electrodes of transistors 276 and 294 are coupled to a collector electrode of transistor 264. Emitter electrodes of transistors 306 and 264 are coupled to bias circuit 312. Bias circuit 312 is configured to produce the desired operating point of mixer which comprises the left-side portion of the circuit of FIG. 5. Bias circuit 312 is further coupled to the base electrodes of transistors 276 and 288, and to the base electrode of transistor 306 through resistor 330. Additionally, bias circuit 312 is coupled to the base electrode of transistor 264 through resistor 324 to isolate the signal applied at node 240 thereto. The base electrode of transistor 294 is additionally coupled to the oscillating signal supplied on line 252.

Transistors 264, 270, 276, 294, and 306, when connected as shown, together form a conventional Gilbert Multiplier circuit such that output line 336 coupled to the collector electrodes of transistors 270 and 276, and output line 342 coupled to the collector electrodes of transistors 288 and 294 contain signals 180 degrees out of phase with one another. Resistors 282 and 300 provide correct source impedances to filters 340 and 350, respectively. The signals on lines 336 and 342 are isolated from each other such that externally induced variations in load impedance on one line do not significantly affect the signal generated on the other line. Nodes 344 and 346 represent pin output connections to permit connection of lines 336 and 342 to filter circuits such as ceramic multielement ladder filters 348 and 350, represented in the Figure in block form. Once suitably connected, signals generated on lines 336 and 342 are supplied to filters 348 and 350, respectively, to be filtered thereat. Such circuit design further ensures that both filters are terminated correctly at all times.

Nodes 356 and 362 represent pin input connections to permit connection of output sides of filters 348 and 350 thereto. Line 368 interconnects node 356 and a base electrode of transistor 380; similarly, line 374 interconnects node 362 and a base electrode of transistor 386. The emitter electrode of transistor 380 is connected to an emitter electrode of transistor 392, and the emitter electrode of transistor 386 is coupled to an emitter electrode of transistor 398. The supply voltage supplied on line 246 is supplied to the collector electrodes of transistors 380 and 386 through resistor 404; similarly, the supply voltage contained on line 246 is supplied to collector electrodes of transistors 392 and 398 through resistor 410. Bias circuit 402 additionally supplies a bias potential to the base electrodes of transistors 380, 386, 392, and 398 through resistors 408, 414, 420, and 424, respectively. Resistors 408 and 414 additionally provide the correct terminating impedances for filters 348 and 350, respectively.

Transistors 380 and 392 together form a conventional differential amplifier; similarly, transistors 386 and 398 together form a differential amplifier. Differential amplifiers formed of transistor pairs 380–396, and 386–398 correspond to amplifiers 200 and 212 shown in block form in FIGS. 4A and 4B. Line 426 extending from the collector electrodes of transistors 380 and 386 corresponds to line 217' of FIGS. 4A and 4B, and line 428 extending from the collector electrodes of transistors 392 and 398 corresponds to line 217 of FIGS. 4A and 4B, and, preferably, form a differential output (separated in phase by 180 degrees). The signals contained on lines 426 and 428 may be used singly, or in combination, as desired.

A filter switch input signal is supplied on line 432 to circuit 440 which generates a signal on either line 452 or 464 (depending upon the polarity of the signal supplied on line 432). Line 452 is coupled to a base electrode of transistor 470 and line 464 is coupled to a base electrode of transistor 476. The collector electrode of transistor 470 is coupled to emitter electrodes of transistors 380 and 392, and the collector electrode of transistor 476 is coupled to the emitter electrodes of transistors 386 and 398. Generation of a signal on line 452 or on line 464 provides a bias voltage to the base electrode of either transistor 470 or 476 to turn on either transistor 470 or transistor 476, thereby steering bias current generated by bias circuit 402 on line 500 to differential amplifiers formed of transistor pairs 380–396, and 392–398, which, as a result, causes an amplified replication of the signals provided at nodes 356 and 362 to be generated on lines 426 and 428. Bias circuit 402 is configured to produce the desired operating point of the amplifiers. Transistors 470 and 476 thereby function as switches which correspond to switch 218 of FIGS. 4A-B. The filter switch input supplied to line 432 corresponds to line 222 of FIGS. 4A-B. Actuation of the switch formed by transistor pair 470–476 permits quick switching between the differential amplifier formed by transistor pair 380–392 and differential amplifier formed by transistor pair 386–398. Appropriate biasing and/or transistor protection circuitry may be additionally utilized and integrated with other portions of the circuit within the integrated circuit of the preferred embodiment.

Figure 6:
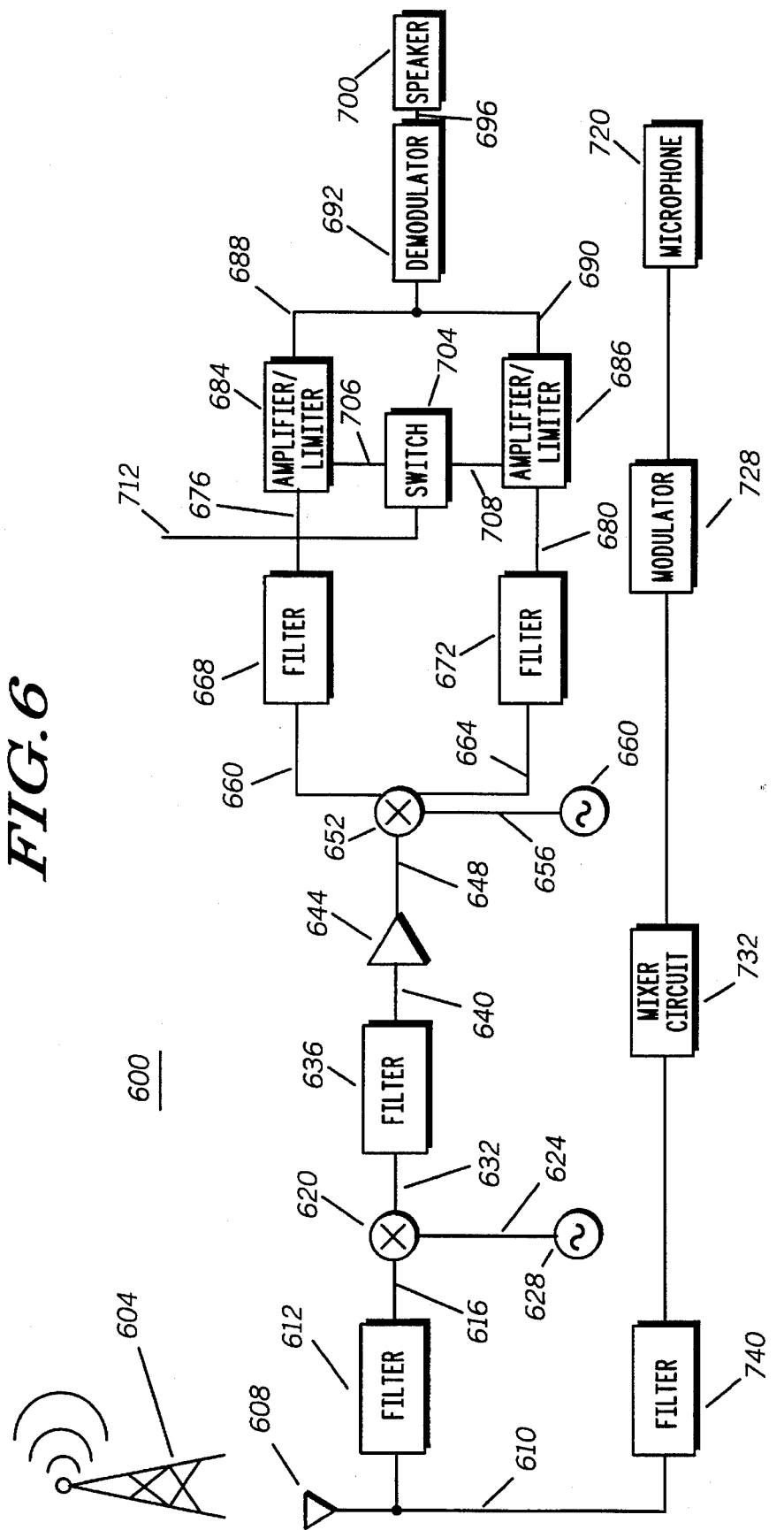
FIG. 6 is a block diagram of a radiotelephone of the present invention in which the filter switching circuit of FIGS. 4–5 forms a portion thereof.

Turning now to the block diagram of FIG. 6, a radiotelephone, referred to generally by reference numeral 600, constructed according to the teachings of the present invention is illustrated. The actual circuitry embodying the functional blocks of the diagram may be disposed upon one or more circuit boards and housed within a conventional radiotelephone housing.

Radiotelephone 600 utilizes the filter switching circuit illustrated in FIGS. 4A–5 to permit reception and demodulation of either a wideband or a narrowband signal transmitted upon a transmission channel of either a conventional, cellular communication system, or, a cellular communication system of expanded capacity. A transmitted signal transmitted by a base station, here represented transmitter 604, is received by radiotelephone antenna 608.

Antenna 608 supplies the received signal on line 610 to preselector/filter 612. Preselector/filter 612 is preferably a very wideband filter having a passband to pass all of the frequencies within a band of interest. Filter 612 generates a filtered signal on line 616 which is supplied to mixer 620. Mixer 620 additionally receives an oscillating signal on line 624 from oscillator 628 which preferably forms a portion of a conventional phase locked loop. Mixer 620 generates a down converted signal (commonly referred to as a first intermediate, frequency, i.e., IF, signal) on line 632 which is supplied to filter 636. (Mixer 620 may alternately generate an up-converted signal.) Filter 636 is, preferably, a monolithic crystal wideband filter, and is commonly referred to as the first intermediate frequency, i.e., IF, filter.

Filter 636 generates a filtered signal on line 640 which is supplied to amplifier 644. Amplifier 644 amplifies the signal supplied thereto on line 640 and generates an amplified signal on line 648. Line 648 is coupled to an input of mixer 652 which also receives an input on line 656 from oscillator 660. Oscillator 660 preferably comprises a portion of a conventional phase locked loop. Mixer 652 forms a drive circuit which generates isolated drive signals on lines 660 and 664. Mixer 652, may, similar to the circuit of FIG. 5, be comprised of a Gilbert Multiplier. The isolated drive signal generated on line 660 is supplied to filter 668; similarly, the isolated drive signal generated on line 664 is supplied to filter 672. Preferably, filters 668 and 672 are comprised of conventional ceramic multielement ladder filters of predetermined passbands. Filters 668 and 672 generate filtered signals on line 676 and 680 which are supplied to amplifier/voltage limiters 684 and 686. Amplifier/limiters 684 and 686 are preferably similar to the differential amplifiers comprised of transistor pairs 380–392 and 386–398 of FIG. 5. Amplifier/limiters 684 and 686 are alternately operable such that either amplifier/limiter 684 generates a signal on line 688 or amplifier/limiter 686 generates a signal on line 690. Because a signal is generated on either line 688 or 690, lines 688 and 690 may be connected theretogether to a single input of demodulator circuit 692. Demodulator circuit 692 typically includes, or is preceded by, additional amplifier/limiter stages. Demodulator circuit 692 generates a demodulated signal on line 696 which is supplied to speaker 700.

Switch 704 is coupled on lines 706 and 708 to limiter/amplifiers 684 and 686, respectively, to supply operating bias alternately to limiter/amplifier 684 or limiter/amplifier 686. An externally generated signal is supplied on line 712 to switch 704 to actuate the switch thereby.

Suitable selection of filter circuit 668 and 672 permits filter 668 to form a wideband filter and filter circuit 672 form a narrowband filter to permit a wideband or narrowband reception of a signal received by antenna 608. Because the signals supplied to filters 668 does and 672 are isolated drive signals, filter circuit 668 does not interfere with filter circuit 672, and vice versa. Amplifier 644, mixer circuit 652, limiters/amplifiers 684 and 686 and switch 704 may be integrally formed upon a single integrated circuit.

The block diagram of FIG. 6 further illustrates a transmit portion of radiotelephone 600 comprising microphone 720, modulator 728, mixer circuit 732 and filter 740, the output of which is coupled to antenna 608.

Figure 7:
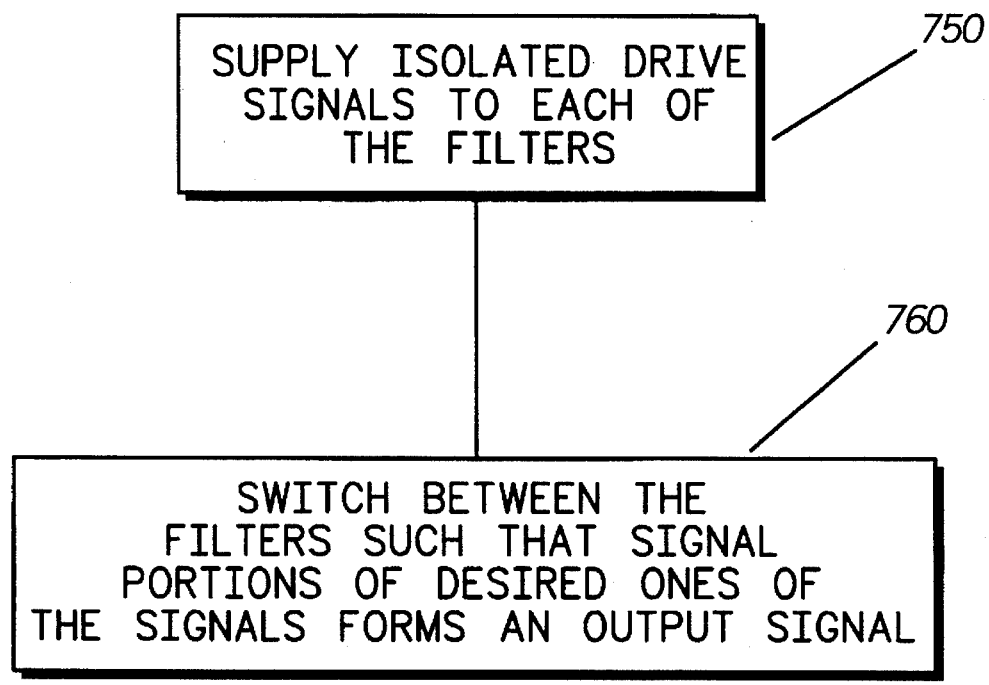
FIG. 7 is a flow diagram representing the method of the preferred embodiment of the present invention.

Turning finally to the flow diagram of FIG. 7, the method steps of the method of the present invention are shown. The method of the present invention switches between at least two filters wherein a first of the filters is operative to pass signal portions of the signal within a first bandwidth, and a second of the filters is operative to pass signal portions of a signal within a second bandwidth. An output signal is formed indicative of signal portions within a bandwidth of a desired one of the filters. The method comprises the steps of: first, as indicated by block 750 of the flow diagram, supplying oscillated drive signals to each of the filters, and, secondly, as indicated by block 760, switching between the filters such that signal portion of the desired one of the filter forms the output signal.

While the present invention has been described in connection with the preferred embodiments of the various figures, it is to be understood that other similar embodiments may be used or modifications and additions may be made to the described embodiments for performing the same function of the present invention without deviating therefrom. Therefore, the present invention should not be limited to any single embodiment, but rather construed in breadth and scope in accordance with the recitation of the appended claims.

We claim:

1. A transceiver operative to receive wideband signals within a first bandwidth and narrowband signals of a second bandwidth, the transceiver comprising:

an antenna;

transmit circuitry coupled to the antenna for transmitting a transmit signal; and an integrated circuit upon which a drive circuit is disposed, the integrated circuit having a first input coupled to the antenna to receive the narrowband signals and the wideband signals, and the drive circuit coupled to the first input to receive the narrowband signals and wideband signals and operative to simultaneously generate a first isolated drive signal at a first output of the integrated circuit and a second isolated drive signal at a second output of the integrated circuit, wherein the first isolated drive signal and the second isolated drive signal generated at the first and second outputs of the integrated circuit, respectively, are isolated from one another;

a wideband bandpass filter of the wideband bandwidth coupled to the first output of the integrated circuit and to a second input of the integrated circuit, the wideband bandpass filter operative to receive the first isolated drive signal generated by the drive circuit at the first output of the integrated circuit, to pass signal portions of the first isolated drive signal of frequencies within the wideband bandwidth, the signal portions of the first signal comprising the signal of the wideband bandwidth, and to apply the signal portions of the first isolated drive signal within the wideband bandwidth to the second input of the integrated circuit;

a narrowband bandpass filter of the narrowband bandwidth coupled to the second output of the integrated circuit and to a third input of the integrated circuit, the narrowband bandpass filter operative to pass signal portions of the second isolated drive signal of frequencies within the narrowband bandwidth, the signal portions of the second signal comprising the signal of the narrowband bandwidth, and to apply the signal portions of the second isolated drive signal within the narrowband bandwidth to the third input of the integrated circuit;

a first amplification circuit disposed upon the integrated circuit upon which the drive circuit is disposed and coupled to receive the signal portions of the first isolated drive signal passed by the wideband bandpass filter;

a second amplification circuit disposed upon the integrated circuit upon which the drive circuit and the first amplification circuit are disposed and coupled to receive the signal portions of the second isolated drive signal passed by the narrowband bandpass filter; and a switching circuit coupled to the first amplification circuit and to the second amplification circuit for alternately permitting powering of the first amplification circuit or of the second amplification circuit, thereby for permitting, alternately, passage of the signal of the wideband bandwidth or the signal of the narrowband bandwidth.

2. The transceiver as defined in claim 1, wherein the narrowband bandpass filter and the wideband bandpass filter are discrete ceramic filters.

3. A dual-bandwidth filter switching circuit connected to a first discrete filter of a first bandwidth and to a second discrete filter of a second bandwidth, the filter switching circuit operative to pass a signal of either a first bandwidth corresponding to the first bandwidth of the first discrete filter or a signal of a second bandwidth corresponding to the second bandwidth of the second discrete filter responsive to application of an input signal to the filter switching circuit, the first and second bandwidths not being equal, the filter switching circuit comprising:

a drive circuit disposed upon an integrated circuit having a first input coupled to receive the input signal and operative to generate a first isolated drive signal at a first output of the integrated circuit for application to the first discrete filter and a second drive signal at a second output of the integrated circuit for application to the second discrete filter wherein the first isolated drive signal and the second isolated drive signal generated at the first and second outputs, respectively, of the integrated circuit are isolated from one another, and wherein a first signal path is coupled to an input of the first filter and a second signal path is coupled to an input of the second filter;

a first amplification circuit disposed upon the integrated circuit upon which the drive circuit is disposed and coupled at a second input of the integrated circuit to an output of the first discrete filter thereby to receive the signal of the first bandwidth passed by the first discrete filter, the first amplification circuit being operative to generate a first amplified signal of the first bandwidth at a third output of the integrated circuit;

a second amplification circuit disposed upon the integrated circuit upon which the drive circuit and the first amplification circuit are disposed and coupled at a third input of the integrated circuit to an output of the second discrete filter thereby to receive the signal of the second bandwidth passed by the second discrete filter, the second amplification circuit being operative to generate a second amplified signal of the second bandwidth at a fourth output of the integrated circuit; and a switching circuit disposed upon the integrated circuit upon which the drive circuit and the first and second amplification circuits are disposed, the switching circuit coupled to the first amplification circuit and to the second amplification circuit for alternately permitting powering of the first amplification circuit or of the second amplification circuit, thereby for permitting, alternately, passage of the first amplified signal of the first bandwidth or the second amplified signal of the second bandwidth.

4. A radio receiver circuit operative to selectively pass a signal of either a wideband or a narrowband for processing by the radio receiver, comprising:

an integrated circuit including a drive circuit, the integrated circuit having a first input coupled to an antenna to receive a received signal, the drive circuit having an input coupled to the first input of the integrated circuit to receive the received signal and operative to generate a first isolated drive signal at a first output of the integrated circuit and a second isolated drive signal at a second output of the integrated circuit, wherein the first isolated drive signal and the second isolated drive signal are maintained in isolation with one another;

a discrete ceramic bandpass filter of a wideband bandwidth coupled to the first output of the integrated circuit to receive the first isolated drive signal generated by the drive circuit, the discrete ceramic bandpass filter operative to pass signal portions of the first isolated drive signal of frequencies within the wideband bandwidth, the discrete ceramic bandpass filter having an output coupled to a second input of the integrated circuit;

a discrete ceramic narrowband bandpass filter of a narrowband bandwidth coupled to the second output of the integrated circuit to receive the second isolated drive signal generated by the drive circuit, the discrete ceramic narrowband bandpass filter operative to pass signal portions of the second isolated drive signal of frequencies within the narrowband bandwidth, the discrete narrowband bandpass filter having an output coupled to a third input of the integrated circuit;

a first amplification circuit disposed upon the integrated circuit upon which the drive circuit is disposed and coupled to the second input of the integrated circuit to receive the signal portions of the first isolated drive signal passed by the discrete ceramic wideband bandpass filter, the first amplification circuit being operative to generate a first amplified signal of the wideband bandwidth at a third output of the integrated circuit;

a second amplification circuit disposed upon the integrated circuit upon which the drive circuit and the first amplification circuit are disposed and coupled to the third input of the integrated circuit to receive the signal portions of the second signal passed by the discrete ceramic narrowband bandpass filter, the second amplification circuit being operative to generate a second amplified signal of the narrowband bandwidth at a fourth output of the integrated circuit; and a switching circuit disposed upon the integrated circuit upon which the drive circuit and the first and second amplification circuits are disposed, the switching circuit coupled to the first amplification circuit and to the second amplification circuit for alternately permitting powering of the first amplification circuit or of the second amplification circuit, thereby for alternately permitting passage of the signal of the wideband bandwidth or the signal of the narrowband bandwidth.

5. The radio receiver filter switching circuit of claim 4 wherein the switching circuit comprises transistor switches.

* * * * *